(12) United States Patent
Wang et al.

(10) Patent No.: US 8,193,837 B2
(45) Date of Patent: Jun. 5, 2012

(54) CORNER DETECTOR

(75) Inventors: Chua-Chin Wang, Kaohsiung (TW);
Ron-Chi Kuo, Kaohsiung (TW);
Jen-Wei Liu, Kaohsiung (TW);
Ming-Dou Ker, Kaohsiung (TW)

(73) Assignee: National Sun Yat-Sen University,
Kaohsiung (TW)

( * ) Notice: Subject to any disclaimer, the term of this patent is extended or adjusted under 35 U.S.C. 154(b) by 187 days.

(21) Appl. No.: 12/845,297

(22) Filed: Jul. 28, 2010

(65) Prior Publication Data

US 2011/0298498 A1 Dec. 8, 2011

(30) Foreign Application Priority Data

Jun. 4, 2010 (TW) .............................. 99118071 A

(51) Int. Cl.
*H03K 5/22* (2006.01)
(52) U.S. Cl. ................ 327/80; 327/81; 327/83; 327/85; 327/87
(58) Field of Classification Search .................... 327/80, 327/81, 83, 85, 87
See application file for complete search history.

(56) References Cited

U.S. PATENT DOCUMENTS 7,646,917 B2 * 1/2010 Jung et al. ..................... 382/199

* cited by examiner

*Primary Examiner* — Kenneth B. Wells
(74) *Attorney, Agent, or Firm* — Muncy, Geissler, Olds & Lowe, PLLC

(57) ABSTRACT

A corner detector comprises a PMOS threshold voltage detector and an NMOS threshold voltage detector, the PMOS threshold voltage detector is composed of a first clock terminal, a first CMOS inverter, a first capacitor, a PMOS threshold voltage function generator and a first voltage output terminal, wherein the PMOS threshold voltage function generator is electrically connected to the first capacitor and applied to generate a first formula of voltage signal as a function of threshold voltage, the NMOS threshold voltage detector is composed of a second clock terminal, a second CMOS inverter, a second capacitor, an NMOS threshold voltage function generator and a second voltage output terminal, wherein the NMOS threshold voltage function generator is electrically connected to the second capacitor and applied to generate a second formula of voltage signal as a function of threshold voltage.

10 Claims, 3 Drawing Sheets

CORNER DETECTOR

FIELD OF THE INVENTION

The present invention is generally relating to a detector, more particularly to a corner detector that is capable of detecting PMOS threshold voltage and NMOS threshold voltage in various process-voltage-temperature (PVT) conditions.

BACKGROUND OF THE INVENTION

A conventional corner detector comprises a circuit system having an output signal terminal, a comparator having a reference terminal and a modulation circuit, wherein the output signal means for sending an output signal, the reference terminal means for providing a reference signal. When an output signal terminal of the circuit system generates an output signal, the reference signal compares with the output signal to determine whether the modulation circuit calibrates the output signal or not. The modulation circuit is able to calibrate frequency distortion from the output signal generated in various process-voltage-temperature (PVT) conditions. However, the modulation circuit merely calibrates frequency distortion from the output terminal of the circuit system therefore enabling effects of potential frequency distortion from the circuit system having PMOS transistors and NMOS transistors are unable to learn.

SUMMARY

A primary object of the present invention is to offer a corner detector comprises a PMOS threshold voltage detector and an NMOS threshold voltage detector, wherein the PMOS threshold voltage detector is composed of a first clock terminal, a first CMOS inverter, a first capacitor, a PMOS threshold voltage function generator and a first voltage output terminal, the first clock terminal means for receiving a clock signal, the first CMOS inverter is electrically connected to the first clock terminal, the first capacitor is electrically connected to the first CMOS inverter, the PMOS threshold voltage function generator is electrically connected to the first capacitor and applied to generate a first formula of voltage signal as a function of threshold voltage, the first voltage output terminal is electrically connected to the PMOS threshold voltage function generator, the NMOS threshold voltage detector is composed of a second clock terminal, a second CMOS inverter, a second capacitor, an NMOS threshold voltage function generator and a second voltage output terminal, the second clock terminal means for receiving the clock signal, the second CMOS inverter is electrically connected to the second clock terminal, the second capacitor is electrically connected to the second CMOS inverter, the NMOS threshold voltage function generator is electrically connected to the second capacitor and applied to generate a second formula of voltage signal as a function of threshold voltage, and the second voltage output terminal is electrically connected to the NMOS threshold voltage function generator. This invention effectively detects PMOS threshold voltage and NMOS threshold voltage in various process-voltage-temperature (PVT) conditions via the first formula of the PMOS threshold voltage function generator and the second formula of the NMOS threshold voltage function generator.

DETAILED DESCRIPTION OF THE INVENTION

Figure 1:
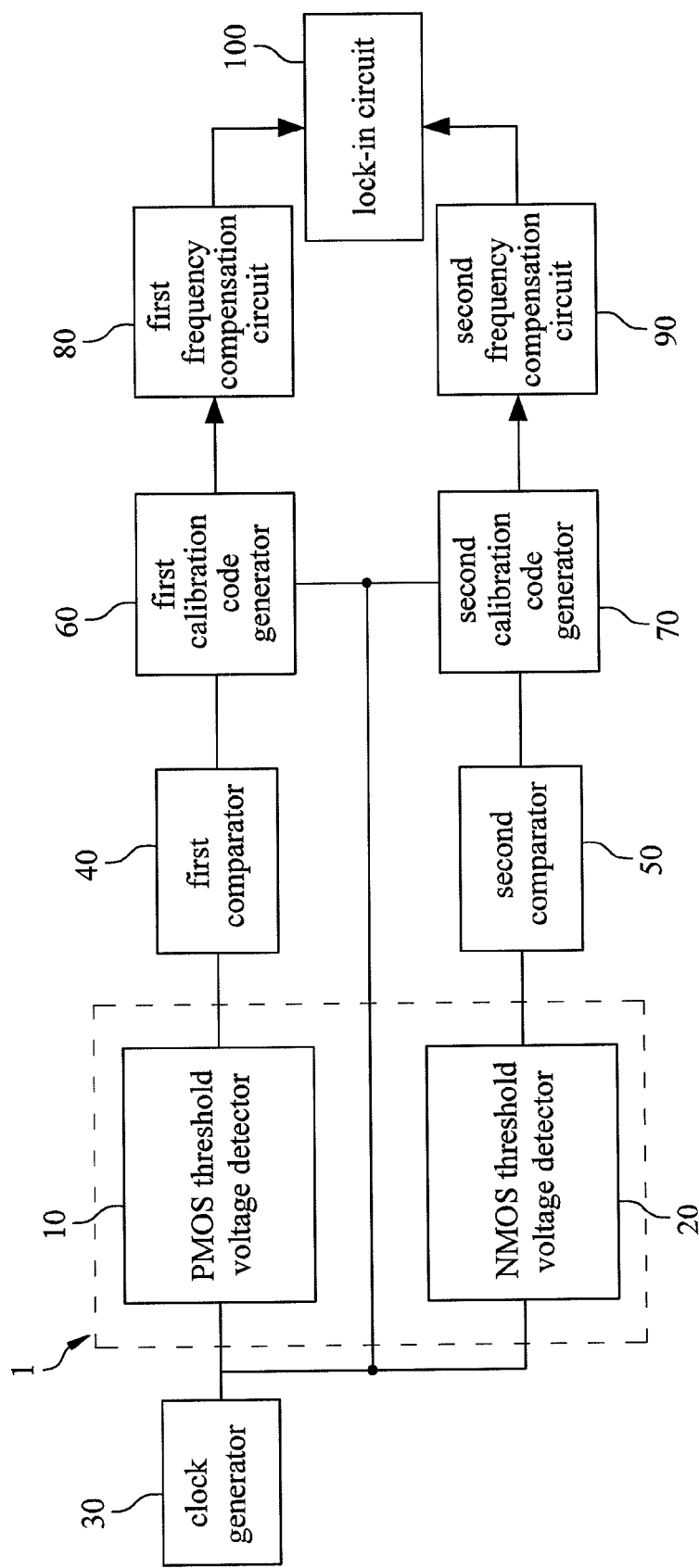
FIG. 1 is a block diagram illustrating a corner detector in accordance with an embodiment of the present invention.
Figure 2:
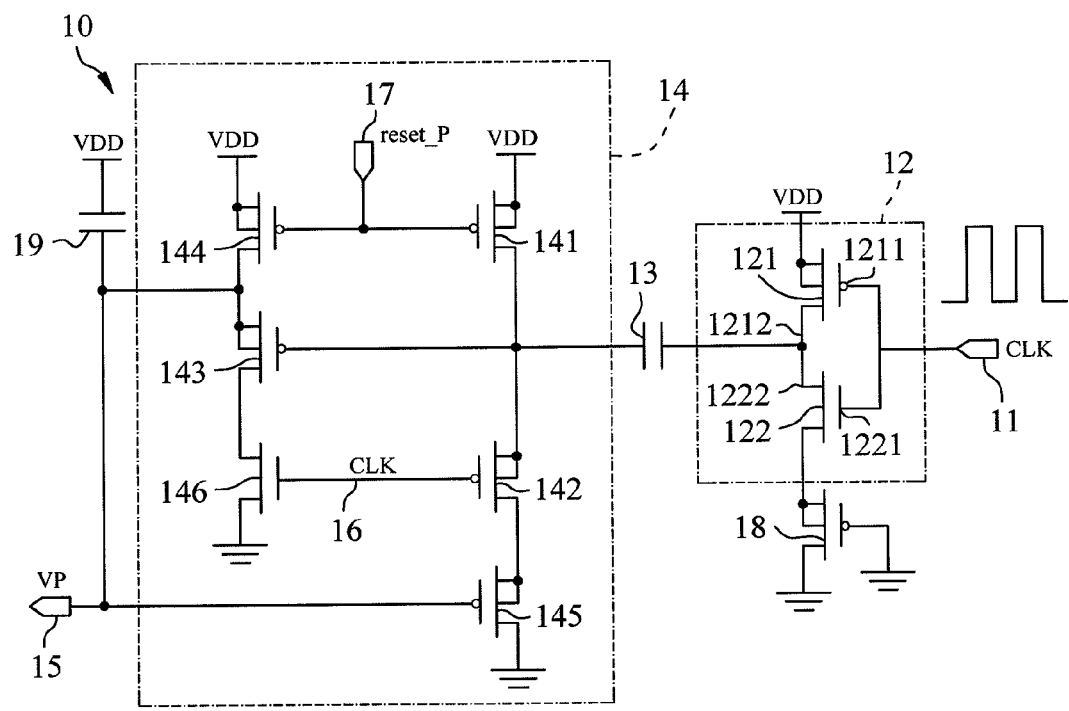
FIG. 2 is a circuit of PMOS threshold voltage detector illustrating the corner detector in accordance with the embodiment of the present invention.
Figure 3:
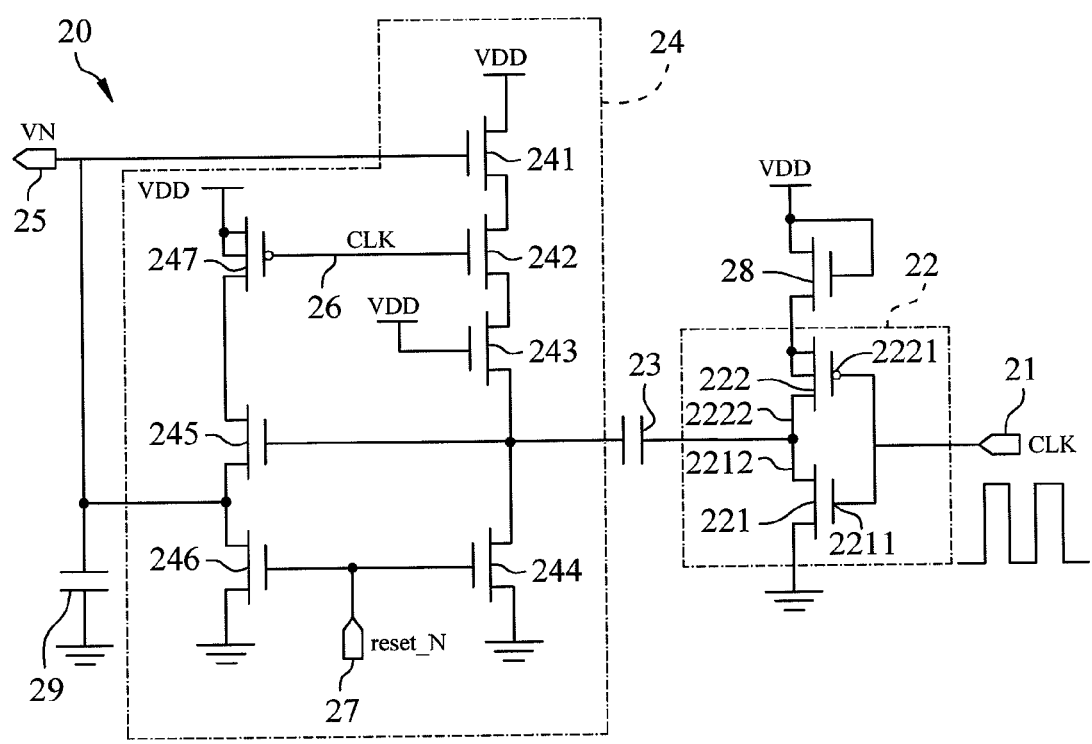
FIG. 3 is a circuit of NMOS threshold voltage detector illustrating the corner detector in accordance with the embodiment of the present invention.

Referring to FIG. 1, a corner detector in accordance with an embodiment of this invention comprises a PMOS threshold voltage detector 10 and an NMOS threshold voltage detector 20. With reference to FIG. 2, The PMOS threshold voltage detector is composed of a first clock terminal 11, a first CMOS inverter 12, a first capacitor 13, a PMOS threshold voltage function generator 14 and a first voltage output terminal 15, wherein the first clock terminal 11 means for receiving a clock signal, the first CMOS inverter 12 is electrically connected to the first clock terminal 11, the first capacitor 13 is electrically connected to the first CMOS inverter 12, the PMOS threshold voltage function generator 14 is electrically connected to the first capacitor 13 and applied to generate a first formula of voltage signal as a function of threshold voltage, and the first voltage output terminal 15 is electrically connected to the PMOS threshold voltage function generator 14. With reference to FIG. 3, the NMOS threshold voltage detector is composed of a second clock terminal 21, a second CMOS inverter 22, a second capacitor 23, an NMOS threshold voltage function generator 24 and a second voltage output terminal 25, wherein the second clock terminal 21 means for receiving the clock signal, the second CMOS inverter 22 is electrically connected to the second clock terminal 21, the second capacitor 23 is electrically connected to the second CMOS inverter 22, the NMOS threshold voltage function generator 24 is electrically connected to the second capacitor 23 and applied to generate a second formula of voltage signal as a function of threshold voltage, the second voltage output terminal 25 is electrically connected to the NMOS threshold voltage function generator 24. With reference to FIG. 1, this invention further comprises a clock generator 30 electrically connected to the PMOS threshold voltage detector 10, the NMOS threshold voltage detector 20, a first calibration code generator 60 and a second calibration code generator 70, wherein the clock generator 30 means for sending the clock signal. In this embodiment, the clock signal is a periodical signal. Preferably, the periodical signal could be a sinusoidal, square or a triangle wave.

Referring to FIG. 2, the first CMOS inverter 12 is composed of a first PMOS transistor 121 and a first NMOS transistor 122, wherein the first PMOS transistor 121 is composed of a gate terminal 1211 and a drain terminal 1212, and the first NMOS transistor 122 having a gate terminal 1221 and a drain terminal 1222. The gate terminal 1211 of the first PMOS transistor 121 and the gate terminal 1221 of the first NMOS transistor 122 are electrically connected to the first clock terminal 11. The drain terminal 1212 of the first PMOS transistor 121 and the drain terminal 1222 of the first NMOS transistor 122 are electrically connected to the first capacitor 13. With reference again to FIG. 2, the PMOS threshold voltage detector 10 further comprises a third clock terminal 16, the PMOS threshold voltage function generator is composed of a second PMOS transistor 141, a third PMOS transistor 142, a fourth PMOS transistor 143, a fifth PMOS transistor 144, a sixth PMOS transistor 145 and a second NMOS transistor 146, wherein the third PMOS transistor 142, the fourth PMOS transistor 143 and the fifth PMOS transistor 144 are electrically connected to the second PMOS transistor 141, the fourth PMOS transistor 143 is electrically connected to the fifth PMOS transistor 144, the sixth PMOS transistor 145 is electrically connected to the third PMOS transistor 142, the second NMOS transistor 146 is electrically connected to the third PMOS transistor 142 and the fourth PMOS transistor 143, the third clock terminal 16 is electrically connected to the third PMOS transistor 142 and the second NMOS transistor 146. In this embodiment, the PMOS threshold voltage detector 10 further comprises a first reset terminal 17 electrically connected to the second PMOS transistor 141 and the fifth PMOS transistor 144. The first reset terminal 17 means for receiving a first reset signal to enable terminal voltage of the first voltage output terminal 15 to be discharged to zero volts. In this embodiment, the PMOS threshold voltage detector 10 further has a seventh PMOS transistor 18 and a third capacitor 19, wherein the seventh PMOS transistor 18 is electrically connected to the first CMOS inverter 12, the third capacitor 19 is electrically connected to the PMOS threshold voltage function generator 14 and the first voltage output terminal 15 and applied to ease the voltage drop effect of the first voltage output terminal 15 caused from parasitic capacitor of the fourth PMOS transistor 143 while the fourth PMOS transistor 143 is in conduction.

Referring again to FIG. 3, the second CMOS inverter 22 is composed of a third NMOS transistor 221 and an eighth PMOS transistor 222, wherein the first PMOS transistor 121 is composed of a gate terminal 2211 and a drain terminal 2212, and the eighth PMOS transistor 222 is composed of a gate terminal 2221 and a drain terminal 2222. The gate terminal 2211 of the third NMOS transistor 221 and the gate terminal 2221 of the eighth PMOS transistor 222 are electrically connected to the second clock terminal 21. The drain terminal 2212 of the third NMOS transistor 221 and the drain terminal 2222 of the eighth PMOS transistor 222 are electrically to the second capacitor 23. With reference again to FIG. 3, the NMOS threshold voltage detector 20 further comprises a fourth clock terminal 26, the NMOS threshold voltage function generator 24 is composed of a fourth NMOS transistor 241, a fifth NMOS transistor 242, a sixth NMOS transistor 243, a seventh NMOS transistor 244, an eighth NMOS transistor 245, a ninth NMOS transistor 246 and a ninth PMOS transistor 247, wherein the fourth NMOS transistor 241 is electrically connected to the fifth NMOS transistor 242, the sixth NMOS transistor 243 and the ninth PMOS transistor 247 are electrically connected to the fifth NMOS transistor 242, the seventh NMOS transistor 244 and the eighth NMOS transistor 245 are electrically connected to the sixth NMOS transistor 243, the ninth NMOS transistor 246 is electrically connected to the seventh NMOS transistor 244 and the eighth NMOS transistor 245, the eighth NMOS transistor 245 is electrically connected to the ninth PMOS transistor 247, and the fourth clock terminal 26 is electrically connected to the fifth NMOS transistor 242 and the ninth PMOS transistor 247. In this embodiment, the NMOS threshold voltage detector 20 further comprises a second reset terminal 27 electrically connected to the seventh NMOS transistor 244 and the ninth NMOS transistor 246. The second reset terminal 27 means for receiving a second reset signal to enable terminal voltage of the second voltage output terminal 25 to be discharged to zero volts. In this embodiment, the NMOS threshold voltage detector 20 further has a tenth NMOS transistor 28 and a fourth capacitor 29, wherein the tenth NMOS transistor 28 is electrically connected to the second CMOS inverter 22, the fourth capacitor 29 is electrically connected to the NMOS threshold voltage function generator 24 and the second voltage output terminal 25 and applied to ease the voltage drop effect of the second voltage output terminal 25 caused from parasitic capacitor of the eighth NMOS transistor 245 while the eighth NMOS transistor 245 is in conduction.

Referring again to FIG. 2, while the PMOS threshold voltage detector 10 receives the clock signal and then increases clock cycles of the clock signal, the PMOS threshold voltage function generator 14 enables the first voltage output terminal 15 to generate the first formula, wherein the first formula can be derived as $V_p = p \times q \times V_{thp} - m \times V_{DD}$, where $V_p$ is the output voltage function and $V_p > 0$, q is the clock cycle, $V_{thp}$ is the threshold voltage of PMOS transistor, $V_{DD}$ is the supply voltage, p is a positive integer, and m is a positive integer smaller than q. In this embodiment, the output voltage function is a first analog signal. Similarly, with reference again to FIG. 2, while the NMOS threshold voltage detector 20 receives the clock signal and then increases clock cycles of the clock signal, the NMOS threshold voltage function generator 24 enables the second voltage output terminal 25 to generate the second formula, wherein the second formula can be derived as $V_n = (V_{DD} - k \times V_{thn}) \times n$, where $V_n$ is the output voltage function and $V_n > 0$, n is the clock cycle, $V_{thn}$ is the threshold voltage of NMOS transistor, $V_{DD}$ is the supply voltage, and k is a positive integer. In this embodiment, the output voltage function is a second analog signal. With reference again to FIG. 1, further in this embodiment, a first comparator 40 is electrically connected to the PMOS threshold voltage detector 10 and applied to receive the first analog signal so as to send a first trigger signal. A second comparator 50 is electrically connected to the NMOS threshold voltage detector 20 and applied to receive the second analog signal so as to send a second trigger signal. The first calibration code generator 60 is electrically connected to the first comparator 40 and applied to receive the first trigger signal so as to send a first calibration code. The second calibration code generator 70 is electrically connected to the second comparator 50 and applied to receive the second trigger signal so as to send a second calibration code. A first frequency compensation circuit 80 is electrically connected to the first compensation code generator 60 and applied to receive the first calibration code so as to send a first voltage signal. A second frequency compensation circuit 90 is electrically connected to the second compensation code generator 70 and applied to receive the second calibration code so as to send a second voltage signal. A lock-in circuit 100 is electrically connected to the first frequency compensation circuit 80 and the second frequency compensation circuit 90 and applied to receive the first voltage signal and the second voltage signal so as to calibrate the frequency shift from the lock-in circuit 100 itself. This invention is able to detect threshold voltage of PMOS transistors and NMOS transistors effectively in various process-voltage-temperature (PVT) conditions via the first formula generated from the PMOS threshold voltage function generator 14 and the second formula generated from the NMOS threshold voltage function generator 24. Besides, variance of threshold voltage from each of the transistors leads to change of the analog signals and enables the first calibration code generator 60 and the second calibration code generator 70 to provide corresponding calibration codes. The corresponding calibration codes are being sent to the frequency compensation code generators therefore providing corresponding voltage signals, wherein the voltage signals are capable of calibrating the frequency shift caused by the lock-in circuit 100.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A corner detector comprising:
a PMOS threshold voltage detector having a first clock terminal, a first CMOS inverter, a first capacitor, a PMOS threshold voltage function generator and a first voltage output terminal, wherein the first clock terminal means for receiving a clock signal, the first CMOS inverter is electrically connected to the first clock terminal, the first capacitor is electrically connected to the first CMOS inverter, the PMOS threshold voltage function generator is electrically connected to the first capacitor and applied to generate a first formula of voltage signal as a function of threshold voltage, and the first voltage output terminal is electrically connected to the PMOS threshold voltage function generator; and
an NMOS threshold voltage detector having a second clock terminal, a second CMOS inverter, a second capacitor, an NMOS threshold voltage function generator and a second voltage output terminal, wherein the second clock terminal means for receiving a clock signal, the second CMOS inverter is electrically connected to the second clock terminal, the second capacitor is electrically connected to the second CMOS inverter, the NMOS threshold voltage function generator is electrically connected to the second capacitor and applied to generate a second formula of voltage signal as a function of threshold voltage, and the second voltage output terminal is electrically connected to the NMOS threshold voltage function generator.

2. The corner detector in accordance with claim 1, wherein the clock signal is a periodic signal.

3. The corner detector in accordance with claim 2, wherein the periodic signal could be a sinusoidal, square or triangle wave.

4. The corner detector in accordance with claim 1 further comprises a third clock terminal, the PMOS threshold voltage function generator is composed of a second PMOS transistor, a third PMOS transistor, a fourth PMOS transistor, a fifth PMOS transistor, a sixth PMOS transistor and a second NMOS transistor, wherein the third PMOS transistor, the fourth PMOS transistor and the fifth PMOS transistor are electrically connected to the second PMOS transistor, the fourth PMOS transistor is electrically connected to the fifth PMOS transistor, the sixth PMOS transistor is electrically connected to the third PMOS transistor, the second NMOS transistor is electrically connected to the third PMOS transistor and the fourth PMOS transistor, the third clock terminal is electrically connected to the third PMOS transistor and the second NMOS transistor.

5. The corner detector in accordance with claim 4, wherein the PMOS threshold voltage detector further comprises a first reset terminal, the first reset terminal is electrically connected to the second PMOS transistor and the fifth PMOS transistor.

6. The corner detector in accordance with claim 1, wherein the first formula can be derived as $V_p = p \times q \times V_{thp} - m \times V_{DD}$, where $V_p$ is the output voltage function and $V_p > 0$, q is the clock cycle, $V_{thp}$ is the threshold voltage of PMOS transistor, $V_{DD}$ is the supply voltage, p is a positive integer and m is a positive integer smaller than q.

7. The corner detector in accordance with claim 1 further comprises a fourth clock terminal, the NMOS threshold voltage function generator is composed of a fourth NMOS transistor, a fifth NMOS transistor, a sixth NMOS transistor, a seventh NMOS transistor, an eighth NMOS transistor, a ninth NMOS transistor and a ninth PMOS transistor, wherein the fourth NMOS transistor is electrically connected to the fifth NMOS transistor, the sixth NMOS transistor and the ninth PMOS transistor are electrically connected to the fifth NMOS transistor, the seventh NMOS transistor and the eighth NMOS transistor are electrically connected to the sixth NMOS transistor, the ninth NMOS transistor is electrically connected to the seventh NMOS transistor and the eighth NMOS transistor, the eighth NMOS transistor is electrically connected to the ninth PMOS transistor, and the fourth clock terminal is electrically connected to the fifth NMOS transistor and the ninth PMOS transistor.

8. The corner detector in accordance with claim 7, wherein the NMOS threshold voltage detector further comprises a second reset terminal, the second reset terminal is electrically connected to the seventh NMOS transistor and the ninth NMOS transistor.

9. The corner detector in accordance with claim 1, wherein the second formula can be derived as $V_n = (V_{DD} - k \times V_{thn}) \times n$, where $V_n$ is the output voltage function and $V_n > 0$, n is the clock cycle, $V_{thn}$ is the threshold voltage of NMOS transistor, $V_{DD}$ is the supply voltage and k is a positive integer.

10. The corner detector in accordance with claim 1 further comprises a clock generator, and the clock generator is applied to send a clock signal and electrically connected to the PMOS threshold voltage detector and the NMOS threshold voltage detector.

* * * * *